US005172034A

United States Patent [19]

Brinkerhoff

[11] Patent Number: 5,172,034

[45] Date of Patent: Dec. 15, 1992

[54] WIDE RANGE DIMMABLE FLUORESCENT LAMP BALLAST SYSTEM

[75] Inventor: Jesse R. Brinkerhoff, Bellevue, Wash.

[73] Assignee: The Softube Corporation, New York, N.Y.

[21] Appl. No.: 712,418

[22] Filed: Jun. 10, 1991

Related U.S. Application Data

[63] Continuation of Ser. No. 501,538, Mar. 30, 1990.

[51] Int. Cl.[5] .......... H03B 39/04

[52] U.S. Cl. .......... 315/307; 315/219; 315/287; 315/DIG. 4

[58] Field of Search .......... 315/DIG. 4, DIG. 5, 315/209 R, 210, 291, 219, 224, 287, 307

[56] References Cited

U.S. PATENT DOCUMENTS 4,259,614 3/1981 Kohler .......... 315/224
4,277,728 7/1981 Stevens .......... 315/194
4,544,863 10/1985 Hashimoto .......... 315/224
4,609,850 9/1986 Hanlet .......... 315/224
4,700,113 10/1987 Stupp .......... 315/224
4,775,822 10/1988 Statnic .......... 315/224
4,949,016 8/1990 De Bijl .......... 315/224

*Primary Examiner*—Eugene R. LaRoche
*Assistant Examiner*—A. Zarabian
*Attorney, Agent, or Firm*—Kimmel, Crowell & Weaver

[57] ABSTRACT

The present invention and its related methods of operation provide a wide range dimmable high frequency lamp ballast system having a resonant circuit associated with each lamp or lamp set for providing a resonant frequency which is substantially higher than the drive frequency at which the lamp or lamp set is driven, and means for automatically selecting a drive frequency to be a submultiple of the resonant frequency of the resonant circuit, the selection of a submultiple being dependent on lamp operating conditions.

7 Claims, 4 Drawing Sheets

ALTERNATE LAMP CONNECTION
FOR VERY LOW BRIGHTNESS

WIDE RANGE DIMMABLE FLUORESCENT LAMP BALLAST SYSTEM

This is a continuation of application Ser. No. 07/501,538, filed Mar. 30, 1990.

BACKGROUND OF INVENTION

The function of a fluorescent lamp ballast is to connect the lamp bulbs to the power line in a way that will provide just enough current to the bulbs to operate them at the desired brightness level. Since the bulbs have a negative resistance characteristic which is dependent on beam current, temperature, bulb type and age, and is very different during starting than during operation once started, this is not a simple task. Standard magnetic ballasts perform the current control function by inserting a relatively large iron core inductor between the bulbs and the source of power. This achieves the control function with adequate stability but to change the brightness level requires changing the inductance, which cannot be done in a simple manner based on a control knob position or control D.C. voltage. Electronic ballasts simulate the action of the inductor with switchmode regulator circuits using feedback techniques to control the voltage across the bulbs based on measured current through them. Over a wide brightness range the impedance of the bulbs changes so much that instability usually results, and the bulbs flicker, turn off, or get into an inefficient operating state where the special coating on the filaments quickly burns off, making the bulbs unusable.

Some current electronic ballasts deal with this problem by operating the bulbs at a relatively high frequency (above the normal audio range) and use inductors and capacitors to form a resonant circuit around the bulbs, with a resonant frequency at or near the frequency at which the bulbs are driven. Thus, as the bulb impedance changes, the "Q" of the resonant circuit changes with it, since the bulb is part of the resonant circuit, and more or less drive voltage is immediately available as required, even though the feedback control circuit might not be able to respond quickly enough if the resonant circuit were not there. This technique works well over a limited range of brightness, but to apply this technique over a wide brightness range, substantial changes in the inductance and capacitance forming the resonant circuit would be required, and there is no practical way to accomplish this.

The present invention uses a resonant circuit around each bulb or bulb set in a similar fashion, but instead of using a resonant frequency at or near the drive frequency, a resonant frequency much higher than the drive frequency is used, i.e. 130 KHz., and the drive frequency is selected to be an exact submultiple of the resonant frequency of the inductive and capacitive resonant circuit components around the bulb. Different submultiple frequencies are selected under different operating conditions, achieving many benefits which would be obtained by changing the inductance and capacitance values of the resonant circuit around the bulb if such changes were practical, which they are not.

OBJECTS OF THE INVENTION

It is therefore an object of the present invention to operate fluorescent lamps over a wide range of brightness while maintaining stable and efficient performance.

It is another object of the invention to allow cooler operation of the fluorescent lamps by not requiring current flow through the lamp filaments.

It is yet another object of the invention to provide around each fluorescent bulb set a resonant circuit, but instead of using a resonant frequency at or near the drive frequency, a resonant frequency much higher than the drive frequency is used.

It is yet still another object of the invention to provide means for selecting the drive frequency to be an exact submultiple of the resonant frequency of the inductive and capacitive resonant circuit components provided in circuit around each fluorescent bulb or bulb set.

It is still yet another object of the invention to provide for the automatic selection of different submultiple frequencies under different operating conditions, thereby achieving many benefits which would be obtained by changing the inductance and capacitance values of the resonant circuit connected around each bulb or bulb set if such changes were practical, which they are not.

It is another object of the invention to provide an energy efficient wide range dimmable fluorescent lamp ballast system which automatically switches between a first (original) lamp drive frequency and a selected submultiple frequency, or between two submultiple frequencies, or between three or more different submultiple frequencies, or even to operate at a single submultiple frequency, and maintain stable and efficient lamp operation and performance.

Many other objects and advantages of the present invention will be readily apparent from the following detailed description of the inventive system operation and its methods of operation.

DETAILED DESCRIPTION OF THE INVENTION

Figure 1:
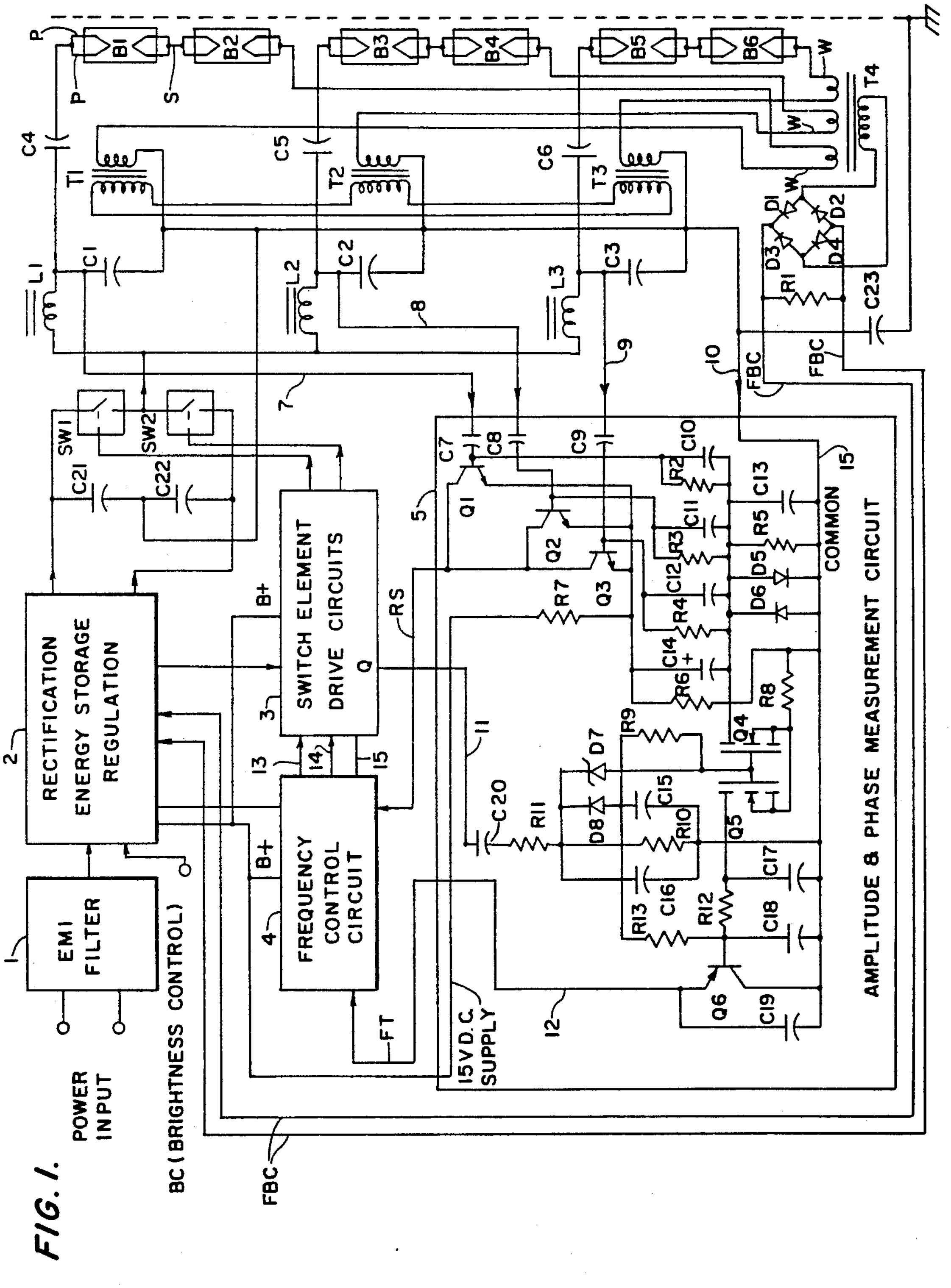
FIG. 1 is a simplified block diagram illustrative of the system of the present invention.

With reference to FIG. 1, block 1 is an EMI (Electro-Magnetic Interference) filter, using standard technology to prevent interference from the switching regulator circuits 2 from feeding onto the power line.

Block 2 illustratively represents a combination of standard switch mode regulator circuits to rectify energy from the power line, temporarily store the energy in capacitors and inductors, and output power to capacitors C21 and C22 and the switching elements SW1 and SW2 in response to the difference between the brightness control input BC and a feedback signal from transformer T4, diodes D1 through D4, and resistor R1, such feedback signal being provided to Block 2 via the feedback circuit FBC. The brightness control input BC may be derived from a potentiometer, not shown, or from an external input.

Block 3 illustratively represents the circuits for driving the lamp ballast drive signal switching elements SW1 and SW2, which are arranged so that SW1 is conducting and SW2 is nonconducting for one half cycle, and then SW1 becomes nonconducting and SW2 conducting for the next half cycle. This procedure is repeated cycle after cycle at a lamp ballast drive signal frequency determined by Block 4. A square wave power signal is thus produced at the junction of SW1 and SW2, with respect to the common point at the junction of C21 and C22. This lamp ballast drive power signal is supplied to bulbs B1 through B6, through the resonant circuits respectively consisting of inductors L1 through L3 and capacitors C1 through C6, along with the small additional capacitance represented by the dotted line connected to ground at the right hand edge of FIG. 1. Note that capacitor C23 provides a low impedance path at high frequencies between the common point, referenced above, and ground.

B1 through B6 are fluorescent bulbs (lamps), each bulb having a filament, connected to two pins P, on each end. Ordinary ballasts, including most electronic ballasts, require separate connections to each filament pin to enable heating current to flow through each filament, in addition to the beam current which flows through the filaments on its way to the plasma path through the gases inside the bulb. With this inventive ballast configuration, only the beam current flows through the filaments, so that the two pins on each end of the bulb can be connected through a single wire S.

One advantage of the invention is to allow operation of a number of bulbs with only one set of switching elements (shown as SW1, SW2). To accomplish this, the lighting ballast circuit is configured into channels. Three channels are shown: the first consists of bulbs B1 and B2, along with L1, C1, C4, T1, C7, Q1, R2, and C10. The second channel consists of bulbs B3 and B4, with L2, C2, C5, T2, C8, Q2, R3, and C11. The third channel consists of bulbs B5 and B6, with L3, C3, C6, T3, C9, Q3, R4, and C12. More than three channels may be used, connected in similar fashion, or only one or two channels may be used.

Each of the channels described above includes a resonant circuit whose frequency is determined by the inductor L1, L2, or L3, and a respective capacitance consisting of C1, C2, or C3, along with the relatively small capacitance of the respective bulbs to the common point set forth above through C4, C5, or C6 and C23. Capacitors C4, C5, and C6 have relatively large capacitance and act as nearly zero impedance connections to the bulbs at the frequencies of operation. Their purpose is to solve a potential problem well known in the technology of fluorescent lamp ballasts which is that the bulbs have a tendency to conduct beam current more readily in one direction than the other, and combined with their negative resistance characteristic, this can easily result in conduction in one direction only. However, with capacitors C4, C5, and C6 in the lighting circuit channels, such a tendency to favor conduction in one direction over the other is quickly compensated by a buildup of D.C. voltage across the capacitors which is just sufficient to equalize the current flow in the two directions.

The before-mentioned inductive and capacitive components in the resonant circuit of each channel are manufactured to be essentially identical to each other, so that the resonant frequency of each channel will be essentially identical. The resonant frequencies will change with conditions such as temperature or aging, and possibly other environmental effects, but each should change in the same fashion and in about the same amount.

Transformers T1, T2, and T3, and similar additional transformers (if used), perform the function of forcing beam current to be shared approximately equally between the channels, even though bulb impedances may not match exactly. A separate transformer for each channel may be used, as shown, or the windings shown may all be wound on a common core, so that a single transformer can perform the sharing function for all channels. If only a single channel is used, no sharing transformer is required. In that case, the connection from the bottom of the last bulb in the single channel would go through a single winding on T4 and then directly to the common point connecting to the junction of capacitors C21 and C22.

In the case of a single channel, L1, C1, C4, T4, C7, Q1, R2, C10, C21, C22, and C23 would remain connected as shown, but the other components listed in the above description would not be required.

Figure 2:
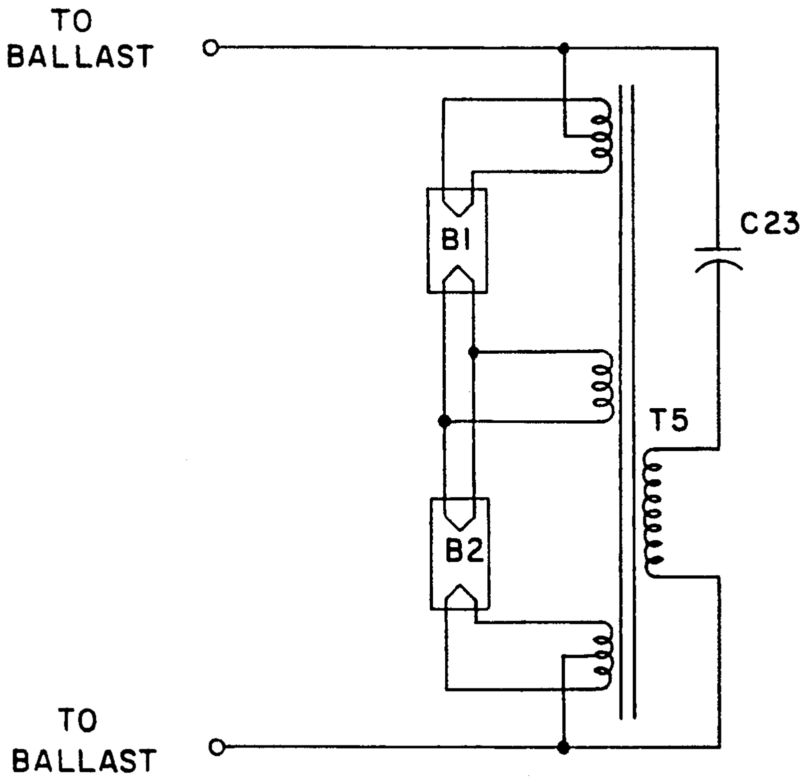
FIG. 2 is a diagram showing an alternate lamp/ballast connection scheme for a very low brightness application.

It is to be noted in FIG. 1 that two bulbs are shown connected in series into each channel. Actually, more than two bulbs or as many bulbs as desired, may be connected in series into each channel, provided that sufficient voltage is available to operate them and the breakdown voltage ratings of the switching elements and other components will not be exceeded. Alternatively, only a single bulb in each channel is also acceptable. Another alternative lamp (bulb) connection configuration for very low brightness is shown in FIG. 2, which is simply exemplary since other configurations could be utilized.

Transformer T4 acts as a current transformer to monitor the average current through all the lamps. Each channel connects through a single turn primary winding W of T4, inducing a current in the secondary winding equal to the sum of the currents in each channel divided by the turns ratio. This current is rectified by diodes D1 through D4, and flows through R1, producing a D.C. voltage proportional to the average bulb current. This D.C. voltage is compared to the brightness control input by the regulator circuitry of Block 2. This regulator controls the D.C. output voltage provided across capacitors C21 and C22 to produce an average lamp (bulb) current proportional to the desired brightness. A more detailed description of the Block 2 circuitry will be presented below.

The heart of the operation of the invention is accomplished in Block 5, in conjunction with that of block 4. The amplitude and phase measurement circuitry of Block 5 has two separate, but related, functions. It receives its inputs from the junctions of L1 and C1, L2 and C2, and L3 and C3 via lines 7, 8, and 9, and C7, C8 and C9 respectively. These three input points allow the voltages driving the three lamp channels to be monitored with respect to the common point connected from the junction of C21 and C22 via line 10 to Block 5. With a square wave lamp drive signal being applied to each resonant circuit, as set forth above, and having a frequency which is a submultiple of the resonant frequency of the resonant circuits, some amplitude of signal at the resonant frequency will be harmonically excited by the square wave drive signal and will be present at the input monitor points at the junctions of L1-C1, etc. If the bulb impedance is low, the "Q" at the resonant frequency will be low, and the resonant frequency signal at the monitoring point will be low. Conversely, if the bulb impedance is high, then the "Q" and the resonant frequency signal at the monitoring point will be high. If the components making up the resonant circuits are properly selected, and the square wave lamp drive frequency is selected at the proper submultiple of the resonant frequency, then over a very wide range of beam current, representing an equally wide range of lamp brightness, the resonant frequency signal at the monitoring point will fall into one of two categories:

(1) If the lamp bulb(s), which is (are) part of the resonant circuit being monitored, is (are) turned on and operating efficiently, the monitored signal will be at a relatively low level, over the entire beam current range.

(2) If the lamp bulb(s), which is (are) part of the resonant circuit being monitored, is (are) not conducting or is (are) in an inefficient and partially conducting state, then the monitored signal will be at a relatively high level.

If, at a particular moment, the state of conduction of the bulb(s) causes the monitored signal level to be at an intermediate value between these two conditions, then the very nature of the resonant circuits, driven at the proper submultiple of their resonant frequency, will rapidly cause the bulb to become more or less conductive until it reverts to one or the other of the two categories just described above.

Figure 3:
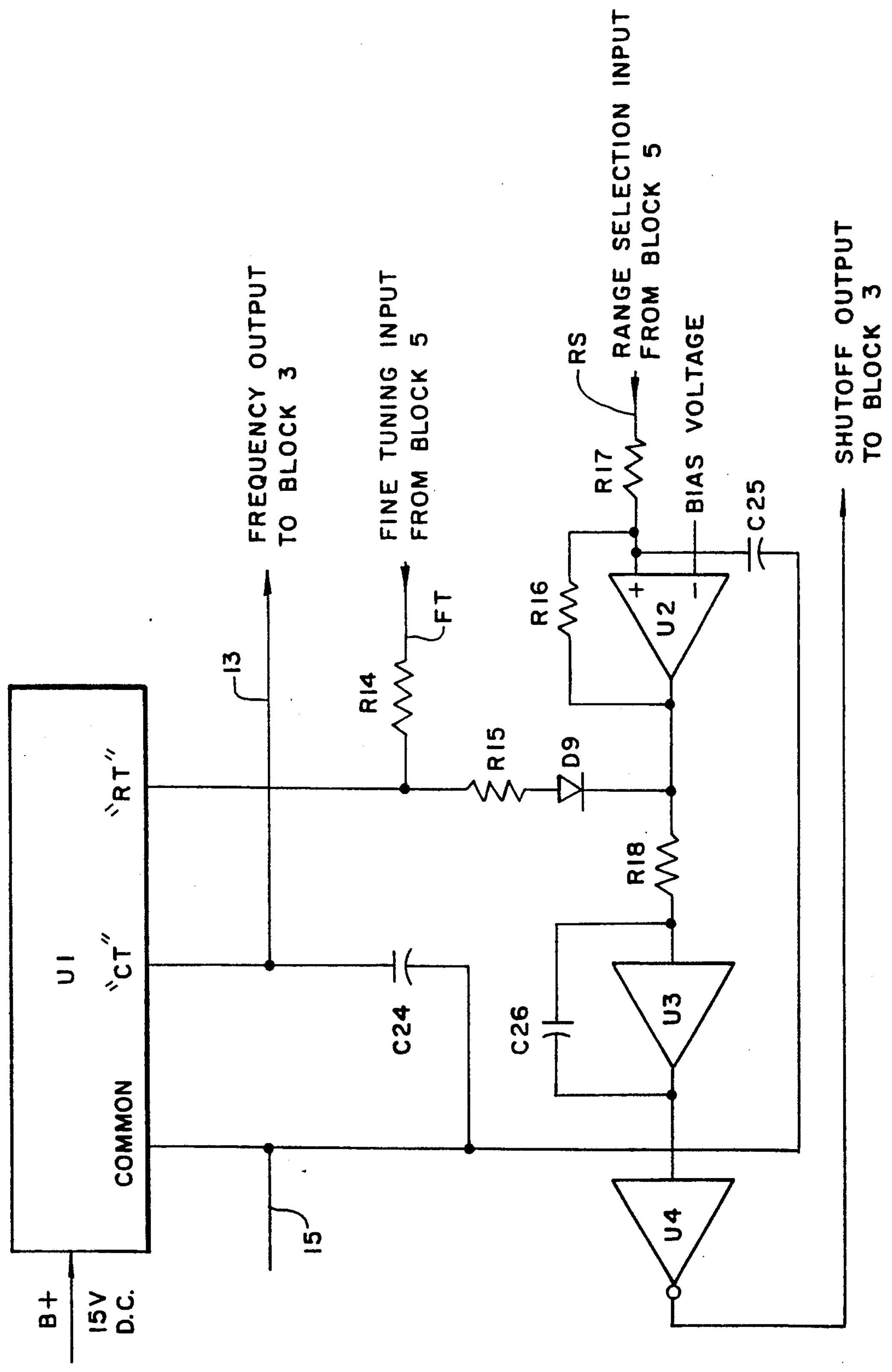
FIG. 3 is a schematic diagram of the frequency control circuit of Block 4 broadly shown in FIG. 1.
Figure 4:
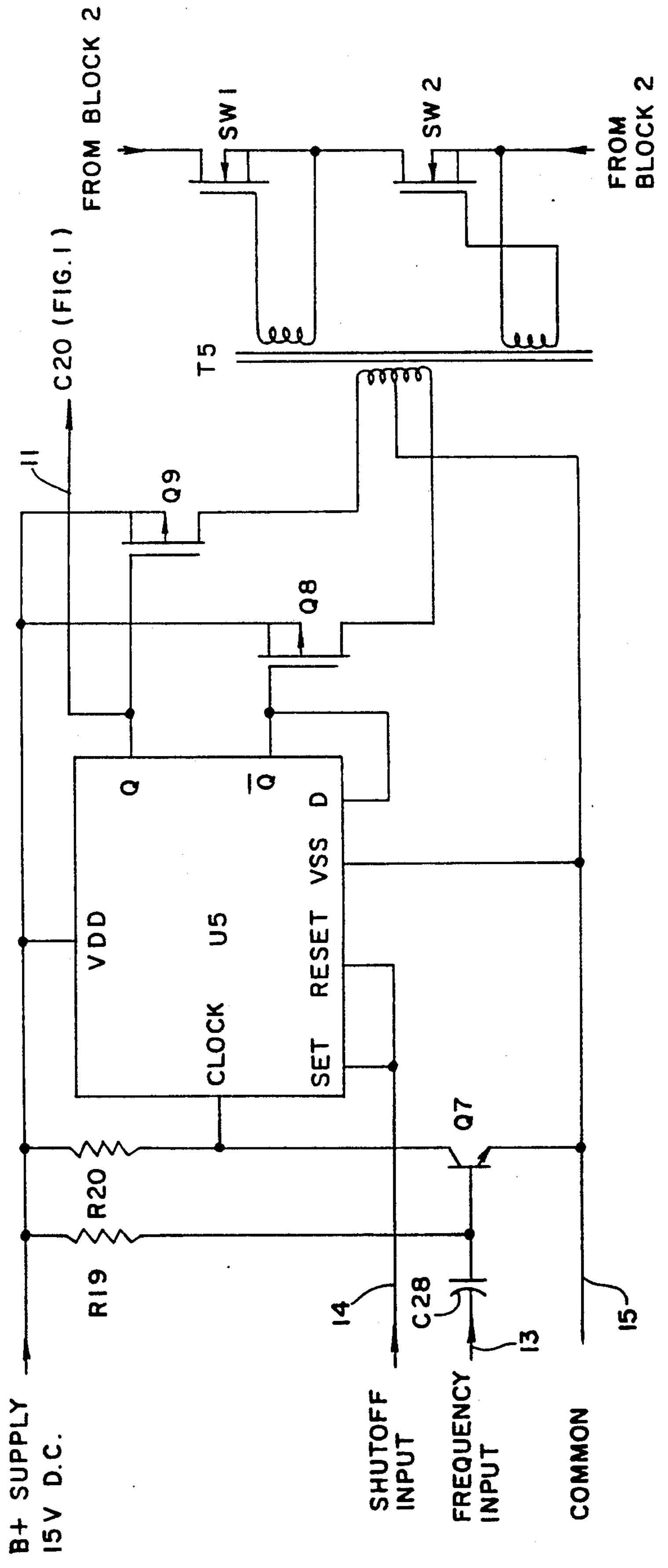
FIG. 4 is a schematic diagram of the switch element drive circuits of Block 3 broadly shown in FIG. 1.

In the preferred embodiment of the present invention depicted in the FIGS. 1, 3 and 4, the resonant frequency of the resonant circuits is set at 130 KHz, the normal square wave lamp drive frequency is set at 26 KHz and a start frequency of 43.33 KHz is utilized. The 26 KHz normal operation lamp drive frequency signal is the 5th submultiple of the 130 KHz resonant frequency, and the start frequency is the 3rd submultiple of 130 KHz. If the bulb condition is in category (1) the output frequency of Block 4 will switch to a higher submultiple number such as the 7th, 9th, 11th, etc. for increased efficiency once the lamp has started. If the bulb condition is in category (2), the output frequency of Block 4 will switch to a lower submultiple number such as 1 or 3 to allow for more power delivery to the bulb. The present invention has been designed to automatically select the odd submultiples of the resonant frequency, but the present invention should not be limited to this design since the invention system can be modified within its scope to select even submultiples of the resonant frequency. Also, for example, the lamps could be driven: at a start frequency of 130 KHz (the 1st submultiple) for a dim condition; at an operating submultiple of 3 for medium brightness; or at an operating submultiple of 5 for maximum brightness.

As shown in FIG. 1 the monitored signal referenced above is applied to either Q1, Q2, or Q3, through a voltage divider consisting of either C7, R2, and C10; C8, R3, and C11; or C9, R4, and C12; and the combination of C13, R5, D5, and D6. R6, R7 and C14 form a bias network controlling the sensitivity of the transistors Q1, Q2, Q3 and minimizing dependence on temperature.

If the bulb condition is in category (1), operating efficiently, the corresponding transistor, either Q1, Q2, or Q3, will be off. If the bulb condition is in category (2), off or operating inefficiently, the corresponding transistor will turn on. These three transistors are connected in an "open collector" logic mode, so that if any one of them turns on, a low level logic signal will be sent to Block 4's RANGE SELECTION input via line RS. If or when such low level logic signal is sent to the frequency control circuit 4, the output frequency of Block 4 will switch to a lower submultiple (higher frequency) of the resonant frequency of the resonant circuits. This will result in a great increase in power delivery to any bulb which is in the category (2) state, and unless the bulb(s) is (are) defective or not connected into the circuit properly, will cause the bulb(s) to quickly switch to and operate within the category (1) state. Assuming the bulb(s) successfully switch(es) to the category (1) state, the monitored signal(s) will then drop in amplitude below the threshold required for turning on the transistor (Q1, Q2, or Q3), and Block 4's output frequency will return to the original (normal operation) submultiple frequency.

As will be explained more fully later, the frequency control circuit means 4 may include a timer circuit so that if it stays in the higher frequency (lower submultiple) condition for more than a short time, an assumption is made that a bulb is either defective or not connected properly, and in either of these cases the drive power to all the lamps is shut off for a substantial period of time, to be restarted later, and if the defect has been cleared, normal operation will resume. If the defect remains, power shutoff will recur.

One may now wonder whether it may be better to always operate in the lower submultiple (higher frequency) mode, rather than to automatically select a higher or lower submultiple dependent upon lamp conditions. The answer to that question is that operating in the lower submultiple mode does put much more power into a bulb which is off or in an inefficient partially conducting state, but it cannot put nearly as much power into a bulb, once it has fully turned on, as operating in the higher submultiple mode. And, whatever power level is being put out, operation is more efficient at the higher submultiple mode once the lamp is started and conducting properly.

The remainder of the circuitry shown in FIG. 1 for Block 5 acts as an automatic fine tuning phase and frequency control circuit means. The actual resonant frequency of the various inductors and capacitors around the bulbs may vary as explained above. If block 4 alone produced a nominal frequency equal to the proper submultiple of the expected resonant frequency, it would not necessarily be accurate. And besides the potential variations in the actual resonant frequency, the circuitry of block 4 may not produce the exact frequency desired, because of the tolerances of its components or other effects. Therefore, the present invention includes provisions for verifying and correcting the match between the submultiple frequency, produced by Block 4, and the resonant frequency of the resonant circuits around the bulbs. Actually, such resonant frequency is the approximate average of the individual resonant frequencies of the resonant circuits in the one or more channels implemented. This is accomplished as follows: The signal at the drain terminal of FET transistor Q4 is a composite signal representing such average, for the various channels, of the resonant frequency signals at the monitored points referred to hereinabove. It has been noted earlier that C13, R5, D5 and D6 form part of a voltage divider, which scales the monitored signals at the resonant frequency to the proper amplitude for operating transistors Q1, Q2, and Q3. C13 and R5, in conjunction with the remainder of that voltage divider, are chosen to provide an impedance which represents the correct phase of the resonant frequency signal for comparison with the square wave drive signal to verify the frequency match or to indicate the amount and direction of mismatch. D5 and D6 limit the maximum amplitude of the signal at the drain terminal of Q4 so that the automatic frequency correction signal being produced by Block 5 will be limited in range to be able to correct for small variations in frequency, but will not be able to pull the frequency out of the nominal range.

Transistors Q4 and Q5 and their associated components form a sample and hold circuit. Block 4 provides a square wave signal at the drive frequency currently being used, which is differentiated by C20 and R10 via circuit line into short negative and positive going pulses. R11 and C16 filter out any noise spikes that are present. The negative going pulses charge C15 through D8 to provide a negative bias voltage through R9, keeping Q4 and Q5 off most of the time. However, each positive going pulse momentarily turns Q4 and Q5 on through D7, charging C17 to whatever the current voltage is at Q4's drain terminal. C17 remains at that voltage until the next positive going pulse, when it is updated by the same process. Thus, the voltage across C17 is a D.C. voltage proportional to the instantaneous voltage at the resonant frequency at the time a positive going edge of the square wave drive signal occurs, and represents the phase of the resonant frequency signal. If the drive frequency is lower than the exact submultiple frequency of the actual instantaneous resonant frequency, the voltage across C17 will be negative, whereas if the drive frequency is too high, the voltage across C17 will be positive. If the drive frequency is exactly right, the voltage across C17 will be zero. This voltage is filtered by R12 and C18 and buffered by Q6, with C19 filtering out any residual noise spikes, and then applied to the FINE TUNING input of block 4 via circuit line 12. This fine tuning signal acts as a feedback control signal to cause Block 4 to adjust its frequency output to compensate for changes or inaccuracies in either the resonant circuit components around the bulbs or in the circuitry of block 4 itself to insure a correct submultiple drive frequency.

An alternative circuit configuration for D7 is an ordinary diode component reversed in polarity with respect to the polarity connection of D7 in FIG. 1.

In the present embodiment of the invention, the frequency control circuit shown in Block 4 of FIG. 1 and in FIG. 3 is implemented using an industry standard TL493 pulse width modulated control integrated circuit U1. The FINE TUNING input referred to above is used as a voltage source for the frequency determining resistor R14. This FINE TUNING input, because of D5 and D6, as mentioned above, has a limited amplitude and can only effect the frequency over a limited range.

The RANGE SELECTION input RS to Block 4 from Block 5 is used to connect an additional frequency determining resistor R15 in parallel with the one going to the FINE TUNING input, to change the frequency range up to a higher frequency (lower submultiple). While this range selection resistor R15 is active, the automatic frequency control means discussed above continues to operate in the same manner to correct the frequency to its new higher value, and when the range selection resistor R15 is inactive, the Block 4 circuit automatically reverts to its original submultiple or frequency mode of operation. A detailed description of the circuitry of Block 4 will now be presented with reference to FIG. 3.

Integrated Circuit U1 is an industry standard TL493 or equivalent pulse width modulation control circuit. Most of its functions are part of the regulation circuitry of Block 2, where it is used in accordance with normal industry practice. The remainder of the functions of U1 are utilized for Block 4. U1's clock rate is controlled by external components connected to the "CT" and "RT" terminals. These components are shown in FIG. 3 and their functions are explained hereinbelow.

Capacitor C24 is connected between the "CT" terminal and common, and its value is selected to provide the desired frequencies in conjunction with the values of R14 and R15 as described below. The signal at the "CT" terminal of U1 is also supplied as a frequency output to Block 3 to control the switching frequency of the lamp drive circuitry.

The FINE TUNING input from block 5 via line FT is more or less positive with respect to common, depending on the direction and amount of frequency correction needed. Resistor R14 supplies the correct amount of current into the "RT" terminal to control the frequency to the desired value.

The RANGE SELECTION input from block 5 via line RS goes through resistor R17 to the non-inverting (+) input of Integrated Circuit U2, a comparator. Capacitor C25 filters any noise present which may cause unintended operation of the frequency range selection. The inverting (−) input of U2 connects to a bias voltage set between the two levels of the RANGE SELECTION input. This bias voltage may be derived from a resistive voltage divider (not shown) connected between the B+ supply and common. For example, such voltage divider could include two resistors, the junction of which connects to the inverting (−) input of U2, the non-junction end of one resistor connecting to B+, and the non-junction end of the other resistor connecting to common.

Resistor R16 provides positive feedback to insure that the output of U2 will always be either fully on (negative) or fully off (positive). When U2 is off, diode D9 is non-conducting, so that the operation of U1 is not affected by the RANGE SELECTION input. But, when the RANGE SELECTION input becomes active (low), U2's output goes low, and diode D9 supplies additional current through Resistor R15 to raise the frequency generated by U1 to the desired submultiple value.

Resistor R18 connects from the output of U2 to the input of Integrated Circuit U3, a non-inverting buffer.

Capacitor C26 provides a delay allowing U2's output to go negative for a short time without effecting the output of U3. However, if U2's output stays negative for a longer time, as it will if a lamp is defective or not properly connected, then U3's output will switch low, latching U3's input until C26 has discharged, after which normal operation will resume.

While U3's output is low, U4, an inverting buffer, supplies a high level shutoff output to block 3 via line 14, to shut off power for the lamps until U3 switches back high again. A detailed description of the circuitry of Block 3 will now be presented with reference to FIG. 4.

As shown in FIG. 4, Integrated circuit U5 is a CMOS D type flip flop, type 4013 or equivalent. The frequency input from Block 4 via line 13 is a ramp signal which goes positive at a relatively slow rate and then goes negative very rapidly. Resistor R19 keeps transistor Q7 turned on (with its collector low) most of the time. However, when the frequency input signal goes low, capacitor C28 supplies enough negative current to overcome the normal positive bias current through R19 and momentarily turn Q7 off, allowing resistor R20 to pull the clock input of U5 up and clock the flip flop.

So long as the shutoff input via line 14 from block 4 is low, its normal state, each clock pulse changes the state of the flip flop outputs. The Q and Q bar outputs will switch, one being high while the other is low, and then vice versa. The connection from the Q bar output to the D input causes this state change with each clock pulse. If the shutoff input goes high, both the set and reset inputs to U5 go active, causing both the Q and Q bar outputs to go high and stay high as long as the shutoff input remains high. As shown in FIG. 4, the Q output is also connected to C20 of Block 5 of FIG. 1 via circuit line 11.

Q8 and Q9 are P Channel FET transistors, with their source terminals connected to the B+ supply, their gate terminals connected to U5's Q bar and Q outputs, respectively, and their drain terminals connected to the center tapped primary of transformer T5, whose center tap connects to common. During normal operation, transistors Q8 and Q9 are alternately turned on and off, one being on while the other is off and vice versa. This produces square wave drive signals across each of the two secondary windings of T5, which alternately turn the two before-mentioned switching elements SW1 and SW2 of FIGS. 1 and 4 on and off. These switch elements are shown as N channel FET transistors, but could be implemented as other types of switching elements. The secondary windings of T5 are isolated and can be equipped with the proper number of turns to drive whatever kind of switching elements are required.

When the shutoff input mentioned above causes U5's Q and Q bar outputs to both go high, transistors Q8 and Q9 are both turned off, and no drive is applied to transformer T5, causing both switching elements SW1 and SW2 to remain off, thereby removing the normal square wave drive to the output section of the circuitry and shutting off the current to the fluorescent bulbs B1-B6.

With additional reference to alternative lamp (bulb) configurations for very low brightness, as shown by example in FIG. 2, at very low brightness levels, the beam current of the lamp(s) becomes so low that efficient current transfer from the filaments to and from the plasma path through the lamp cannot take place without extra heating of the filaments. The invention includes a provision for providing extra current through the filaments at very low beam current levels if operation down to very low brightness levels is required. FIG. 2 shows an example of this option for one channel, wherein the filament pins on each end of each bulb connect to an auxiliary transformer T5, as shown, rather than being tied together and connecting directly to the ballast. The primary winding of T5 has a large number of turns compared with each of the secondary windings, and connects through capacitor C23, whose value is selected to be resonant with the primary inductance of T5 at approximately the same frequency as the resonant frequency of the resonant circuits referred to earlier. Thus, at very low beam current levels, when the impedance of the bulb or lamp is high, there is a high level of signal at the resonant frequency, which produces substantial current flow through T5 and each filament winding. At higher brightness levels, the bulb impedance is lower and there is less signal at the resonant frequency, so there will be less filament current. At high brightness levels, where efficiency is most important, filament current will be almost zero, so that negligible power will be wasted. Each channel is intended to use a separate transformer connected in the same manner as T5, if plural channels are used.

With further reference to FIGS. 1 and 4, one pair of switch elements SW1 and SW2 are shown as a "half-bridge" type. The present invention applies equally well to other switch circuit arrangements, such as a full bridge type with four switching elements in an "H bridge" arrangement, where the load would be connected between the halves of the "H bridge".

The present invention is intended to cover any fluorescent lamp ballast system where the lamps are associated with resonant circuits and the drive for the lamps is supplied at a frequency at or near one or more submultiple frequencies of the resonant frequency. One of the submultiple frequencies may be the resonant frequency itself i.e. 1st submultiple.

As set forth above the invention provides a system and methods for switching back and forth between at least two submultiple frequencies, but the invention is intended to cover the options of always operating at a single submultiple or of operating at three or more different submultiples.

With the present invention system and methods fluorescent lamps can be operated at much higher brightness levels than known to be available in the field of this invention. For example ordinary 40 watt fluorescent lamps can be operated at power levels of 80 watts or more.

While the invention system has been described in conjunction with a specific preferred embodiment thereof, it is evident that many alternatives, modifications and variations will be apparent to those skilled in the art in light of the foregoing description. Accordingly, it is intended to embrace all such alternatives, modifications and variations which fall within the spirit and scope of the appended claims.

I claim:

1. In a wide range dimmable high frequency fluorescent lamp ballast system of the type having associated with each lamp or lamp set a resonant circuit having a resonant frequency at or near the drive frequency at which said lamp or lamp set is driven, the improvement comprising: resonant circuit means for providing a resonant frequency which is substantially higher in frequency than the drive frequency at which a lamp or lamp set is driven, and means for automatically selecting said drive frequency to be a submultiple of the resonant frequency of said resonant circuit means, dependent upon lamp conditions, whereby different submultiple frequency drive signals are selected with respect to different lamp operating conditions.

2. A wide range dimmable high frequency lamp ballast system comprising in combination:

lamp means having associated therewith resonant circuit means for providing a resonant frequency which is substantially higher in frequency than the drive frequency at which said lamp means is driven; and means for automatically selecting, dependent upon the operating condition of the said lamp means, said drive frequency to be a submultiple of the resonant frequency of said resonant circuit means, whereby different submultiple frequency drive signals are selected with respect to different lamp operating conditions.

3. A system as defined in claim 2, further comprising:

means for producing a submultiple lamp drive power signal which is selected in accordance with a detected lamp operation condition; and means for detecting lamp operation conditions and dependent therefrom providing control signals which control said means for producing said submultiple lamp drive power signal to selectively produce a submultiple of said resonant frequency in accordance with said detected lamp operation condition.

4. A system as defined in claim 3, further comprising:

amplitude and phase measurement circuit means for detecting the amplitude, phase and frequency of the resonant frequency signal of said resonant circuit means, said amplitude being representative of a lamp operating condition.

5. A method of operating a wide range dimmable high frequency lamp ballast system comprising the steps of:

providing a resonant circuit means for each lamp or lamp set means of said system;

providing a resonant frequency of said resonant circuit which is substantially higher in frequency value than the drive frequency at which said lamp or lamp set means is driven; and automatically selecting, dependent upon the operating condition of the said lamp means, said drive frequency to be a submultiple of said resonant frequency of said resonant circuit, whereby different submultiple frequency drive signals are selected with respect to different lamp operating conditions.

6. A method as defined in claim 5, further comprising the steps of:

producing a submultiple lamp drive power signal which is selected in accordance with a detected lamp operation condition; and detecting lamp operation conditions and dependent therefrom providing control signals for controlling the selection and production of said submultiple lamp drive power signal.

7. A method as defined in claim 6, further comprising the step of:

detecting the amplitude, phase and frequency of said resonant frequency of the said resonant circuit, said amplitude being representative of a lamp operating condition.

* * * * *